United States Patent [19]
Saitoh

[11] Patent Number: 5,418,735
[45] Date of Patent: May 23, 1995

[54] DETECTION OF EVENT-OUTSTRIPPING AND GLITCHES IN HARDWARE LOGIC SIMULATOR

[75] Inventor: Minoru Saitoh, Kawasaki, Japan
[73] Assignee: Fujitsu Limited, Kawasaki, Japan
[21] Appl. No.: 976,327
[22] Filed: Nov. 13, 1992
[51] Int. Cl.$^6$ ............................................ G06F 15/20
[52] U.S. Cl. ............................. 364/578; 364/488; 364/489; 371/23; 371/22.3
[58] Field of Search .................. 371/23, 22.3, 25.1; 364/578, 488, 489; 395/500; 324/158 R, 158 P

[56] References Cited

U.S. PATENT DOCUMENTS

| | | | |
|---|---|---|---|
| 4,527,249 | 7/1985 | Van Brunt | 364/578 |
| 4,656,580 | 4/1987 | Hitchcock, Sr. et al. | 395/500 |
| 4,787,061 | 11/1988 | Nei et al. | 395/500 |
| 4,787,062 | 11/1988 | Nei et al. | 395/500 |
| 4,908,576 | 3/1990 | Jackson | 371/22.3 |
| 4,942,615 | 7/1990 | Hirose | 364/578 |
| 5,091,872 | 2/1992 | Agrawal | 364/578 |

FOREIGN PATENT DOCUMENTS

| | | |
|---|---|---|
| 0404444 | 12/1990 | European Pat. Off. . |
| 63-204441 | 8/1988 | Japan . |
| 3-269674 | 12/1991 | Japan . |
| 4-3229 | 1/1992 | Japan . |
| 2248321 | 4/1992 | United Kingdom . |

*Primary Examiner*—Emanuel T. Voeltz
*Assistant Examiner*—Alan Tran
*Attorney, Agent, or Firm*—Staas & Halsey

[57] ABSTRACT

Event packets are input to an event handler both in a scheduling phase and in a dispatching phase of an event scheduler. In the scheduling phase, EVCNT of a device of an occurring event is counted up by 1, and in the dispatching phase, EVCNT of a device of a mature event is counted down. In the dispatching phase multiple events are detected based on the EVCNT. If an old status of the top event of the multiple events is equal to a current status of the device, it is decided that event-outstripping has occurred, and events are cancelled. If the old status is not equal to the current status, it is decided that a glitch occurs, and events are modified according to a given mode value. Since the event handler can be implemented by a simple combination logic unit, acceleration performance of a logic simulation accelerator is not adversely affected.

15 Claims, 10 Drawing Sheets

| CASE | INPUT | | | | | | OUTPUT | | | | |
|------|-----|------|--------|----|---------|------|-------|------|------|----|----|
| | MU | EVCNT | NSM/OLDS | XO | NSM/NSMT | MODE | EVOUT | OLDS | NEWS | MU | XO |
| (i)    | 0 | ≤1 |     |   |     |     | 1 | OLDS | NEWS |   |   |
| (ii)   | 0 | ≥2 | <,> |   |     |     | 0 | —    | —    |   |   |
| (iii)  | 0 | ≥2 | =   |   |     |     | 0 | —    | —    |   |   |
| (iv)   | 0 | ≥2 | =   |   |     | 0   | 1 | OLDS | ×    | 1 | 1 |
| (v)    | 1 | ≤1 |     | 0 | <,> | 1,2 | 1 | NSM  | NSMT | 1 |   |
| (vi)   | 1 | ≤1 |     | 0 | =   |     | 0 | —    | —    | 1 |   |
| (vii)  | 1 | ≤1 |     | 1 |     | 0,1 | 1 | ×    | NSMT | 0 | 0 |
| (viii) | 1 | ≤1 |     | 1 |     | 2   | 0 | —    | —    | 0 | 0 |
| (ix)   | 1 | ≥2 |     |   |     |     | 0 | —    | —    | 0 | 0 |

BLANK : NOT REFERRED

BLANK : NOT CHANGED

DETECTION OF EVENT-OUTSTRIPPING AND GLITCHES IN HARDWARE LOGIC SIMULATOR

BACKGROUND OF THE INVENTION

1. Field of the Invention

The present invention relates to a logic circuit for detecting outstripping of events and glitches occurring in simulated devices and for appropriately processing outputs of those devices, in a hardware logic simulation accelerator, and a hardware logic simulation accelerator including the same.

2. Description of the Related Art

A hardware logic simulation accelerator or a simulation engine, as disclosed, for example, in U.S. Pat. No. 4,942,615, is widely used to reduce execution time of a logic simulator simulating logic circuits consisting of a large number of logic devices. Recently, as simulated logic circuits become larger, more complex, and faster, hardware logic simulation accelerators have been required to be able to handle more detailed propagation delay times of the logic devices without negatively influencing acceleration performance.

In Japanese Unexamined Patent Publication (Kokai) No. 4-3229, a hardware logic simulation accelerator comprising an evaluation gate buffer having three evaluation gate memories in order to separately handle logic devices having substantially zero delay time such as wired OR's or AND's in ECL (Emitter Coupled Logic) from general logic devices having definite propagation delay times, is described by the same inventor as the present application.

Also, in Japanese Unexamined Patent Publication (Kokai) No. 3-26974, a hardware logic simulation accelerator comprising an event scheduler for handling logic devices having various propagation delay times, is described by the same inventor as the present application. When an input condition that changes an output of a simulated logic device is applied to the device, i.e., when an event occurs in the device, the event is stored with propagation delay time of the device into an event list of the event scheduler, and the event scheduler dispatches the event from the event list after the propagation time has elapsed on a simulation time scale.

In the event scheduler described in Kokai No. 3-26974, events scheduled in the event list are successively dispatched as they mature. However, in actual logic devices, if two conditions that change the output in opposite directions are successively applied to the device at an interval shorter than propagation delay time of that device, the device does not exhibit simple behavior. For example, if propagation delay time of the condition applied second elapses prior to propagation delay time of the condition applied first, the output of the device does not appear to change. Therefore, in the logic simulator, if an event that has occurred later outstrips another event that has occurred earlier, i.e., if event-outstripping occurs in the event list, these events must be cancelled.

Alternatively, if the propagation delay time of the condition applied first elapses prior to the propagation delay time of the condition applied second, a glitch appears to occur in the output of the device. In this situation, two events are successively dispatched from the event list, and thus a pulse having a short duration appears in the output of the simulated device. If the output of the actual device is a data signal changing in synchronization with a clock signal, the glitch does not cause a problem because the output becomes stable before the next clock pulse is input to the following stage. In this case, it is preferable to cancel the two events in order to reduce the number of evaluation times of propagating events (inertia delay mode). If the output of the actual device is a clock signal or a reset signal or an ancestor thereof, the glitch or descendant thereof may cause a malfunction such as racing. In this case, it is necessary to warn of this condition by outputting an undefined state from the simulated device during the short pulse. Furthermore, if the output of the actual device is included in a feedback loop, the glitch may cause undesired oscillation. In this case, it is necessary to warn of the condition by holding the undefined state until a definite event occurs and that event matures.

In order to detect the occurrence of event-outstripping or a glitch to process the outputs as mentioned above, it may be necessary to search the contents of the event list to find events for the same device and to perform operations such as cancellation of events or alteration of the undefined state. In a software simulator, these operation can be easily realized. In a hardware accelerator, however, these operations require large scale of hardware and adversely affect the acceleration performance.

SUMMARY OF THE INVENTION

It is an object of the present invention to provide a logic circuit that can detect occurrence of event-outstripping and glitches to perform necessary operations without adversely affecting acceleration performance of a hardware logic simulation accelerator, and that is realized by a compact wired logic circuit.

It is another object of the present invention to provide a logic simulator including the above logic circuit.

In accordance with the present invention there is provided a circuit for handling events occurring in event driven simulation of a logic circuit consisting of a plurality of simulated devices, comprising means for counting events that occur and have not taken effect yet in each of the simulated devices, means for storing count values generated by the counting means, means for deciding disposition of a mature event based on the count value of the simulated device where the mature event has occurred, and means for handling the mature event according to the disposition decided by the decision means.

In accordance with the present invention there is also provided a logic simulator for performing event driven simulation of a logic circuit consisting of a plurality of simulated devices, comprising means for evaluating future statuses of the simulated devices to release an event when the future status is not equal to a current status of the simulated device, means for scheduling the event released from the evaluation means to dispatch a mature event, means for counting events scheduled in the scheduling means and not taking effect yet for each of the simulated devices, means for storing count values generated by the counting means, means for deciding disposition of the mature event based on the count value of the simulated device where the mature event has occurred, means for handling the mature event according to the disposition decided by the decision means, means for determining fan-out devices of the devices where the mature event occurs, means for storing identifiers of the fan-out devices to prepare for a next evaluation time by the evaluation means, and means for renewing statuses of the simulated devices according to the mature events handled by the handling means.

DESCRIPTION OF THE PREFERRED EMBODIMENTS

Figure 1:
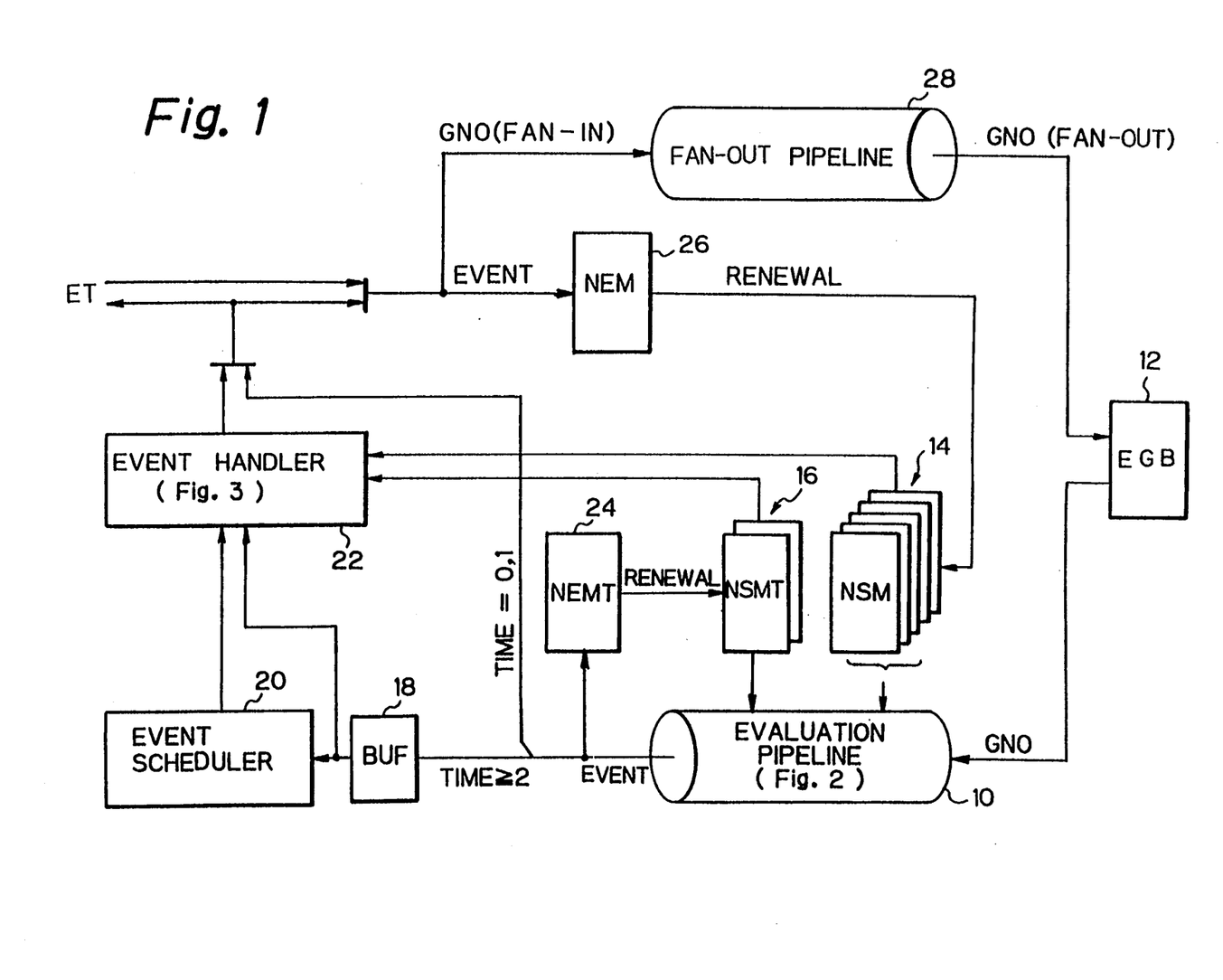
FIG. 1 is a block diagram showing a construction of one evaluation processor included in a logic simulation system according to an embodiment of the present invention.

FIG. 1 shows the construction of one evaluation processor included in a logic simulation system according to an embodiment of the present invention.

An evaluation pipeline 10 has a pipeline construction consisting of multiple stages. The evaluation pipeline 10 successively receives gate numbers (GNO) stored in an evaluation gate buffer (EGB) 12 and successively evaluates outputs of devices specified by the gate numbers based on net values stored in a first net status memory (NSM) 14 and stored temporarily in a second net status memory (NSMT) 16. If an output of a device proves to be about to change as a result of the evaluation, an event packet is released from the evaluation pipeline 10. The event packet includes data of propagation delay time of the device in the form of an integer value on a unit scale of simulation time that corresponds to fineness of the actual propagation delay time.

Event packets having propagation delay time (TIME) of two or more time units are scheduled through a buffer 18 into an event scheduler 20 described in Kokai No. 3-26974 and mature events are dispatched from the scheduler 20. An event handler 22 separately counts the events scheduled in the event scheduler 20 with respect to individual devices, and handles the mature events based on the counts and the net values stored in the NSM 14 and the NSMT 16. Event packets having a propagation delay time (TIME) of 0 or 1 time units bypass the event scheduler 20 and the event handler 22. Copies of the event packets released from the evaluation pipeline 10 are temporarily stored in a first new event memory (NEMT) 24.

Event packets having addresses of other evaluation processors among the event packets output from the event handler 22 and the event packets bypassing the event scheduler 20 and the event handler 22 are sent through an event transmission network (ET) to other evaluation processors. The other event packets and the event packets sent from the other evaluation processors through the ET are stored in a second new event memory (NEM) 26, and gate numbers included therein are fed into a fan-out pipeline 28.

The fan-out pipeline 28 has a pipeline construction consisting of multiple stages. The fan-out pipeline 28 determines fan-out devices of the device specified by the input gate number. Gate numbers of the fan-out devices released from the fan-out pipeline 28 are stored in the EGB 12. The EGB 12 comprises three evaluation gate memories in order to separately handle logic operations from other devices involving substantially zero delay time, as described in Kokai No. 4-3229.

Through one simulation time interval, gate numbers stored in one of the three memories (a first memory) are fed to the evaluation pipeline 10, and if the gate number released from the fan-out pipeline 28 specifies a logic device having zero delay, the gate number is stored in one of the other two memories (a second memory). If the gate number specifies a device having a non-zero propagation delay time, the gate number is stored in the other memory (a third memory). After the first memory in both the same evaluation processor and in the other evaluation processors has become empty, the gate numbers stored in the second memory are successively fed to the evaluation pipeline 10 until the second memory becomes empty, and gate numbers released from the fan-out pipeline 28 are separately stored in the other two memories if the gate numbers include the gate number of a zero delay logic device. The above process is repeated until the fan-out pipeline 28 no longer releases the gate numbers of zero delay logic devices in all of the evaluation processors. In a next simulation time interval, the third memory will play the role of the first memory.

After the above evaluation operation has finished in all of the evaluation processors, the contents of the NSM 14 and the NSMT 16 are renewed with the contents of the NEM 26 and the NEMT 24, respectively. Thus, the NSM 14 retains a net status in each simulation time, whereas the NSMT 16 retains an imaginary net status assuming that all definite propagation delay times were unit delays. As shown in FIG. 1, the NSM 14 and the NSMT 16 respectively include five and two memories, with the memories in each group each having the same contents, in order to enable simultaneous access to various addresses. In a write operation, the same data are simultaneously written to these memories as described in U.S. Pat. No. 4,942,615.

Figure 2:
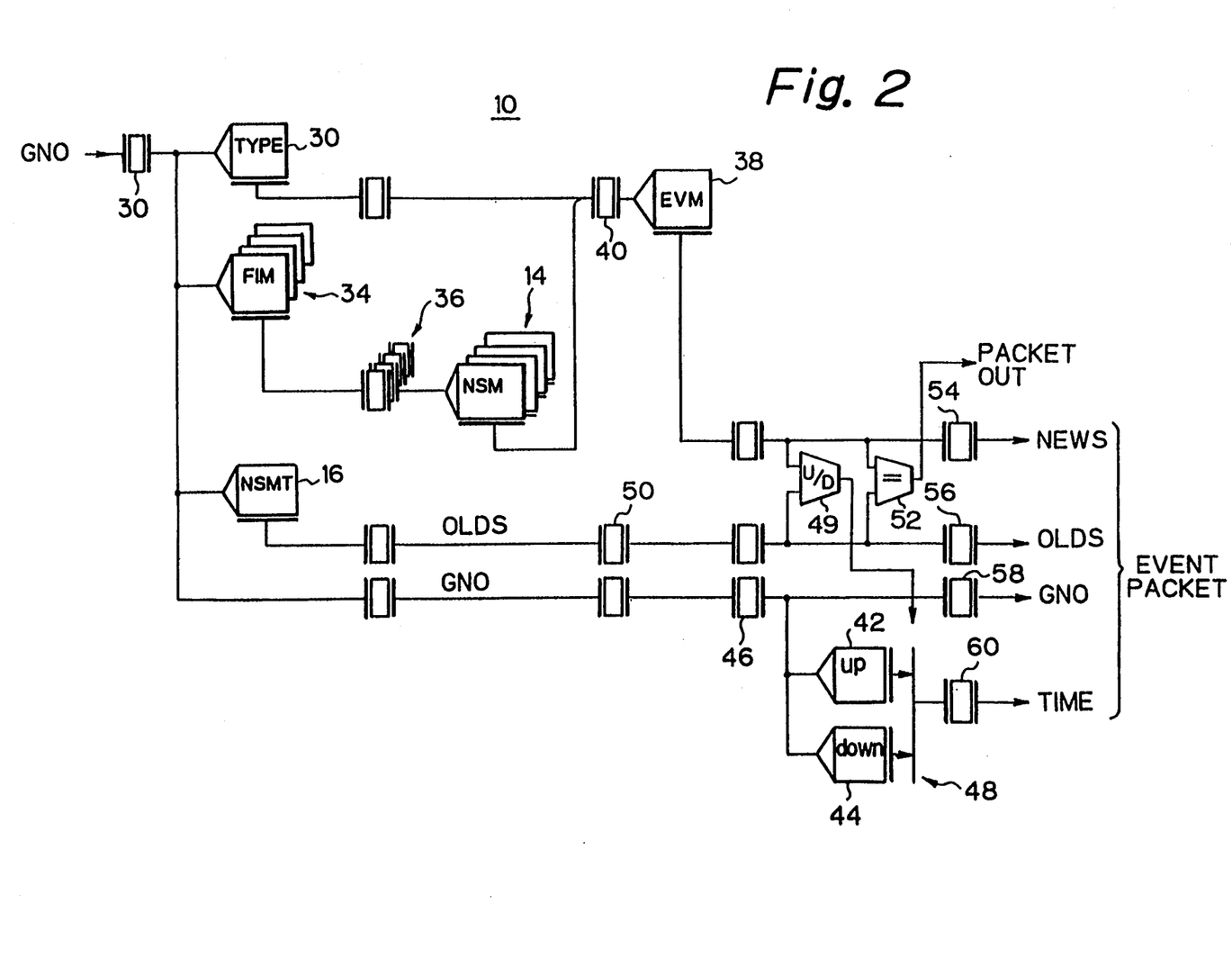
FIG. 2 is a circuit diagram showing a detailed construction of an evaluation pipeline 10 of FIG. 1.

FIG. 2 shows a detailed construction of the evaluation pipeline 10. A memory (TYPE) 32 stores device types of each of the simulated devices. Four fan-in memories (FIM) 34 store gate numbers of four or less fan-in devices of each of the logic devices.

In a first stage of the evaluating pipeline 10, the TYPE 32, the FIM 34, and one memory of the NSMT 16 are addressed by a gate number retained in a register 30, and a device type, gate numbers of fan-in devices, and a net status (old status; OLDS) of the evaluated device, are output, respectively.

In a second stage, four memories of the NSM 14 are addressed by each of the gate numbers of the fan-in devices retained in register 36, and a net status of the fan-in devices, i.e., input values of the evaluated status, is output.

An evaluation memory (EVM) 38 stores truth tables of each type of the simulated devices. In a third stage, the EVM 38 is addressed by the device type and the input values retained in register 40 and a new status (NEWS) of the evaluated device is output.

Memories 42 and 44 store integer values of propagation delay times of each of the simulated devices at the rising edge and falling edge, respectively. In a fourth stage, the memories 42 and 44 are addressed by a gate number retained in a register 46 and integer values of the propagation delay time of the evaluated gate at the rising edge and falling edge, respectively, are output. A selector 48 controlled by a logic circuit 49 selects the integer value at the rising edge or at the following edge as an integer value of delay time (TIME) of the evaluated device, according a truth table shown in Table I.

TABLE I

| OLDS | NEWS | TIME |
| --- | --- | --- |
| 0 | 1 | up |
| 1 | 0 | down |
| x | 0 | down |
| x | 1 | up |
| 0 | x | up |
| 1 | x | down |

If the NEWS output from the EVM 38 is not equal to the OLDS retained in a register 50 in a comparator 52, an event packet including the NEWS, OLDS, GNO, and TIME retained in registers 54, 56, 58 and 60 are released from the evaluation pipeline 10. Since the OLDS used in the decision of occurrence of an event is read out not from the NSM 14 but from the NSMT 16, two or more successive opposite conditions applied during the propagation delay time generate two or more event packets.

Figure 3:
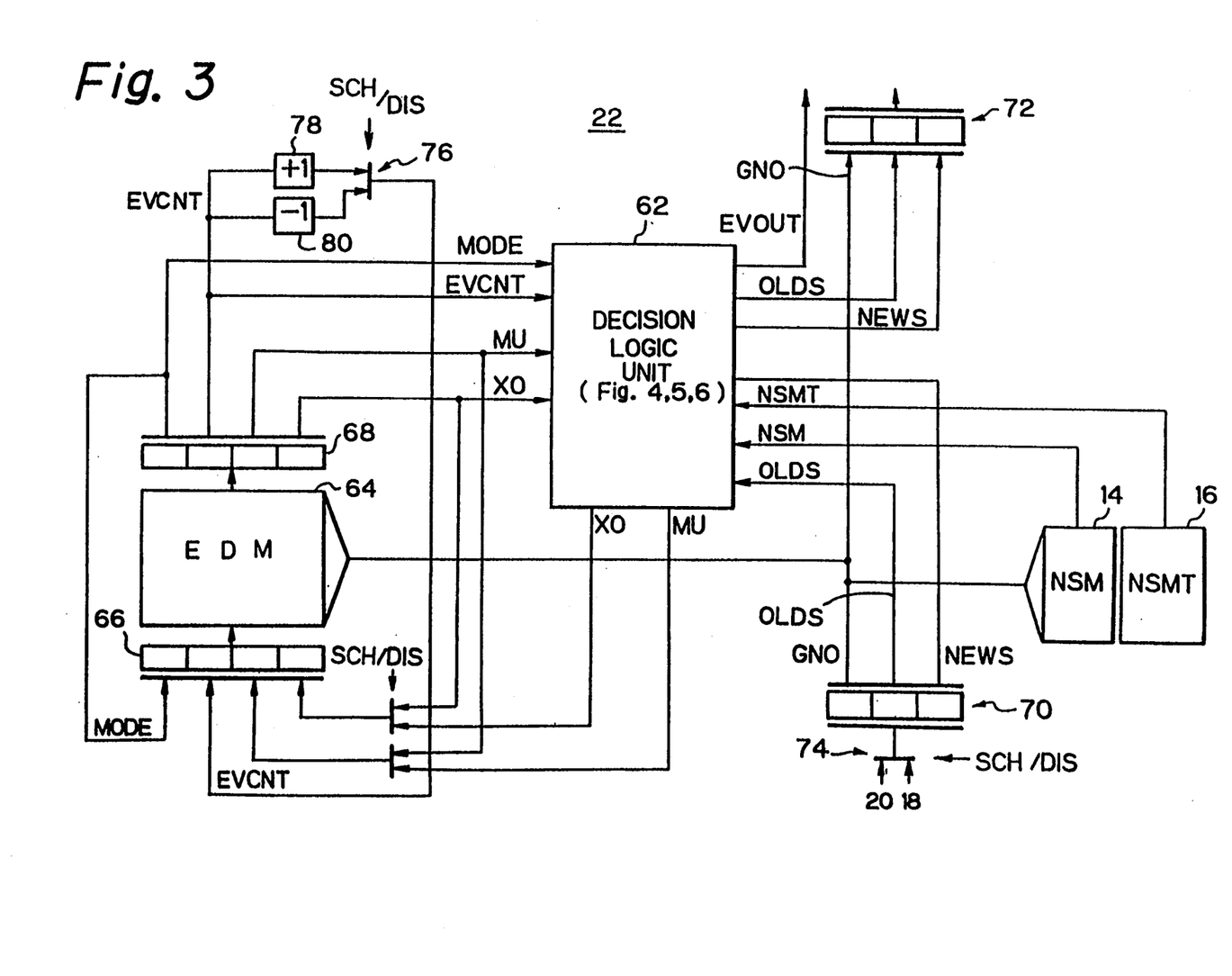
FIG. 3 is a circuit diagram showing a detailed construction of an event handler 22 of FIG. 1.

FIG. 3 shows a detailed construction of the event handler 22. The event handler 22 includes a decision logic unit 62, an event decision memory (EDM) 64, an EDM write register 66, an EDM read register 68, an event input register 70 and an event output register 72. The EDM 64 is addressed by a gate number (GNO) and retains parameters MODE, EVCNT, MU, and XO with respect to each of the gate numbers. The MODE parameters are initially set according to desired operation modes when occurrence of a glitch is detected. For example, regarding a device where a short pulse is desired to be eliminated, MODE is set to "0", regarding a device where appearance of the undefined state during a short pulse is desired, MODE is set to "1", and regarding a device where it is desired to continue the undefined state, MODE is set to "2".

The event scheduler 20 of FIG. 1 operates in two operation phases consisting of an event scheduling phase and a mature event dispatching phase. In the event scheduling phase of the event scheduler 20, a selector 74 selects the event packet from the buffer 18 and a selector 76 selects an output of an adder 78, according to a signal SCH/DIS. Therefore, a copy of an event packet which is scheduled to be sent into the scheduler 20 is retained in the event input register 70. Then, the contents of the EDM 64 addressed by the gate number of the scheduled event are read out to the EDM read register 68. An EVCNT (event count) retained in the EDM read register 68 is increased by 1 in the adder 78 and is input to the EDM write register 66. In a memory write cycle, the increased EVCNT is written with the unchanged MODE, XO and MU, to the EDM 64 addressed by the same gate number.

In the mature event dispatching phase of the event scheduler 20, the selector 74 selects the event packet from the event scheduler 20 and the selector 76 selects an output of a subtracter 80. Namely, in this phase, the EVCNT of the device for the dispatched event is decreased by one. Thus, the EVCNTs represent numbers of events that have occurred and have not taken effect yet with respect to each of the simulated devices.

In this phase, the decision logic unit 62 decides the disposition of the mature event retained in the input register 70 based on contents of the NSM 14, NSMT 16 and EDM 64 addressed by the gate number. When the decision logic unit 62 decides to cancel the event, the decision logic unit 62 sets a signal EVOUT to a "false"-level. When the decision logic unit 62 decides to pass the event or a modified event, the decision logic unit 62 sets the signal EVOUT to a "true" level and outputs the event or the modified event to the event output register 72. When the EVOUT is true, the event retained in the event output register 72 is released.

Figure 4:
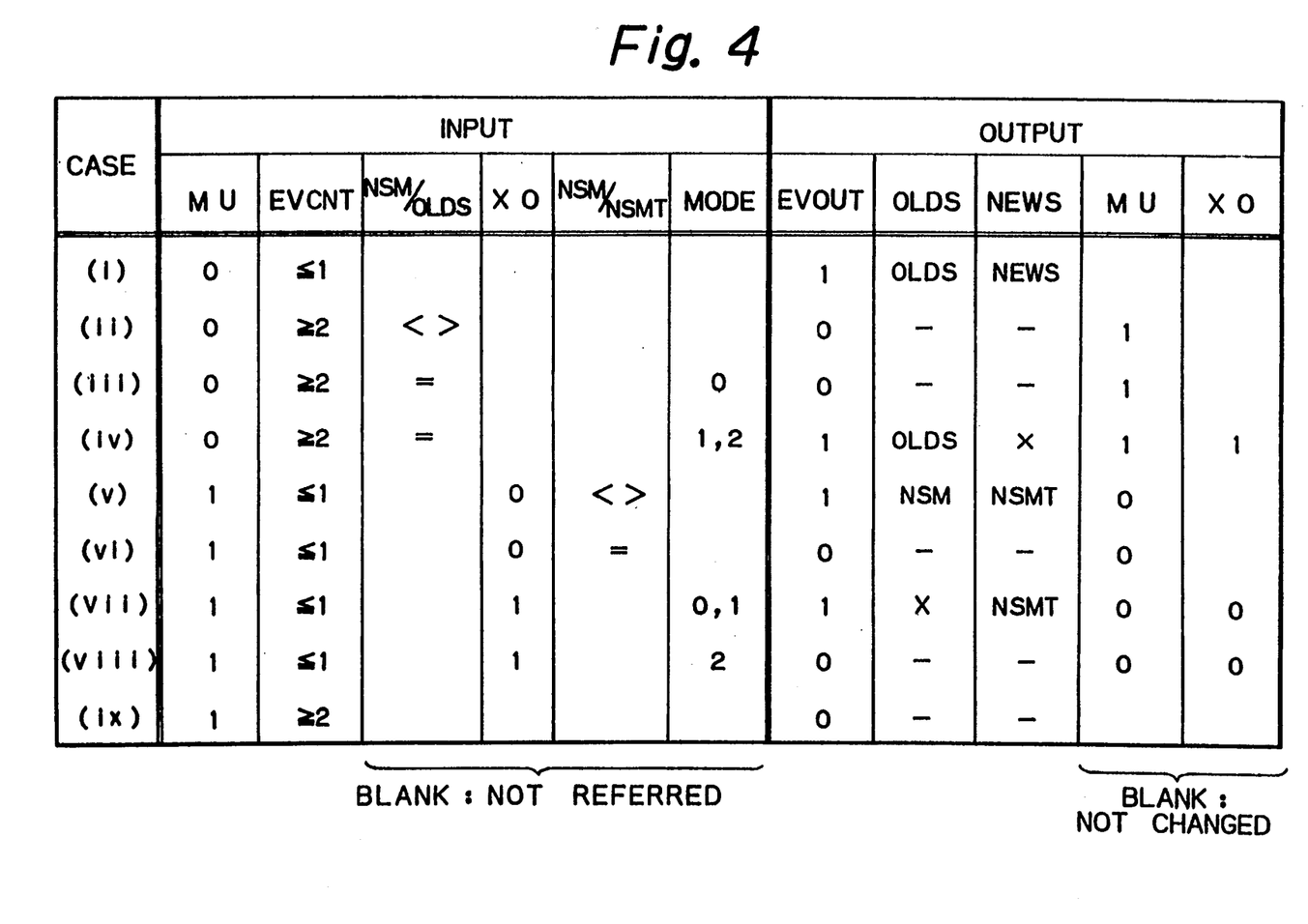
FIG. 4 is a diagram showing a truth table of a decision logic unit 62 of FIG. 3.

FIG. 4 shows a truth table of the decision logic unit 62. In a case (i) of FIG. 4, MU is zero (initial value) and EVCNT is 1. This indicates that during a period from occurrence to maturity of the event other events did not exist as far as the same device is concerned, because the MU is set to "1" when one event of multiple events is released as shown later. Thus, the OLDS and the NEWS retained in the event input register 70 are output to the event output register 72 and the EVOUT is set to a "true" level.

In cases (ii) to (iv), MU is zero and EVCNT is two or more. EVCNT ≧2 means that another event or other events for the same device remain in the event scheduler, i.e., multiple events occur, and MU=0 means that this event is to be dispatched first among the multiple events. Thus, MU is set to 1 in the cases (ii) to (iv) to indicate that a process of multiple events has begun with respect to the device. In the case (ii), NSM is not equal to OLDS. This means that this event has outstripped another event that has changed the NSMT, that is, event-outstripping has occurred. Thus, EVOUT is set to "false" to cancel this event. In cases (iii) and (iv), NSM is equal to OLDS. This means that this event changes the output and another following event will again reverse the output, that is, a glitch occurs. Thus if MODE is zero (case (iii)), this event is cancelled by setting EVOUT to "false", and if MODE is 1 or 2, NEWS of this event is modified to X and EVOUT is set to "true". Simultaneously, XO is set to "1" to indicate that a net value of the device has been altered to an undefined value.

In case (ix), MU is "1" and EVCNT is 2 or more. This means that this event is one dispatched neither first nor last among multiple events. In this case, this event is cancelled by setting EVOUT to "false".

In cases (v) to (viii), MU is "1" and EVCNT is 1. This means that this event is one dispatched last among multiple events. MU is set to "0" in cases (v) to (viii). In case (v), XO is zero and NSM is not equal to NSMT. This means that the undefined value has not been output from the device and that a current net value indicated by NSM is not equal to a value caused by an input condition finally applied to the device. Thus, NSM is fed to OLDS of the output register, NSMT is fed to NEWS of the output register, and EVOUT is set to "true", in order to change the net value of the device to the value caused by the finally applied input condition. In case (vi), NSM is equal to NSMT. This means that a current net value of the device is equal to a value caused by a finally applied input condition. This event is cancelled by setting EVOUT to "false". In case (vii) and (viii), XO is "true". This means that an undefined value is output from the device. Then, if MODE is 1, X is fed to OLDS of the output register and NSMT is fed to NEWS of the output register, and EVOUT is set to "true", in order to change the net value from X to a value caused by the finally applied input condition. If MODE is "2", this event is cancelled to maintain the undefined value. In cases (vii) and (viii), XO is reset to zero.

The logic operations represented by the truth table of FIG. 4 can be easily implemented by a combination logic circuit. Therefore, a process for handling a single event is performed within a single memory cycle.

Figure 5:
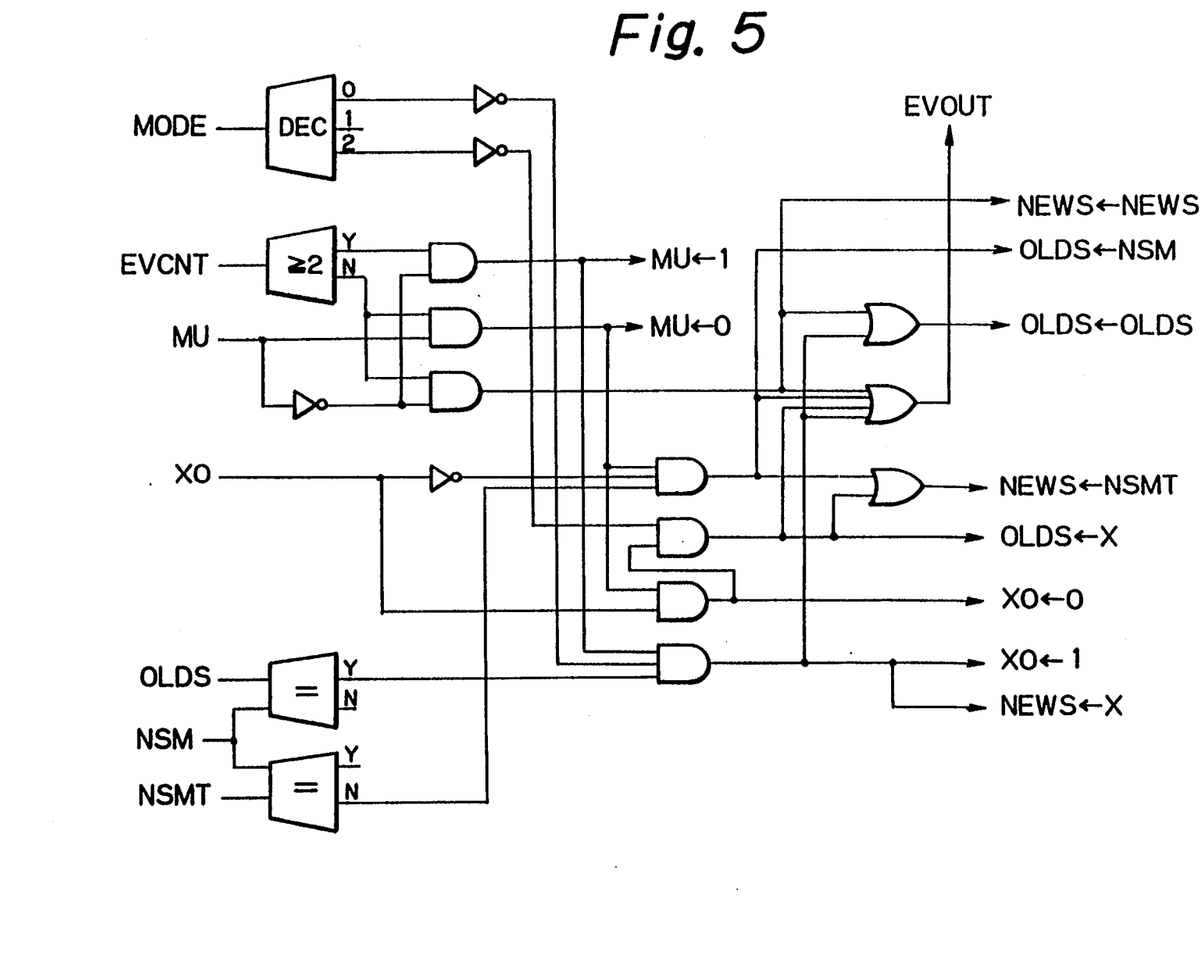
FIG. 5 is a logic circuit diagram of an example of a circuit for generating various selection signals in the decision logic unit 62.
Figure 6:
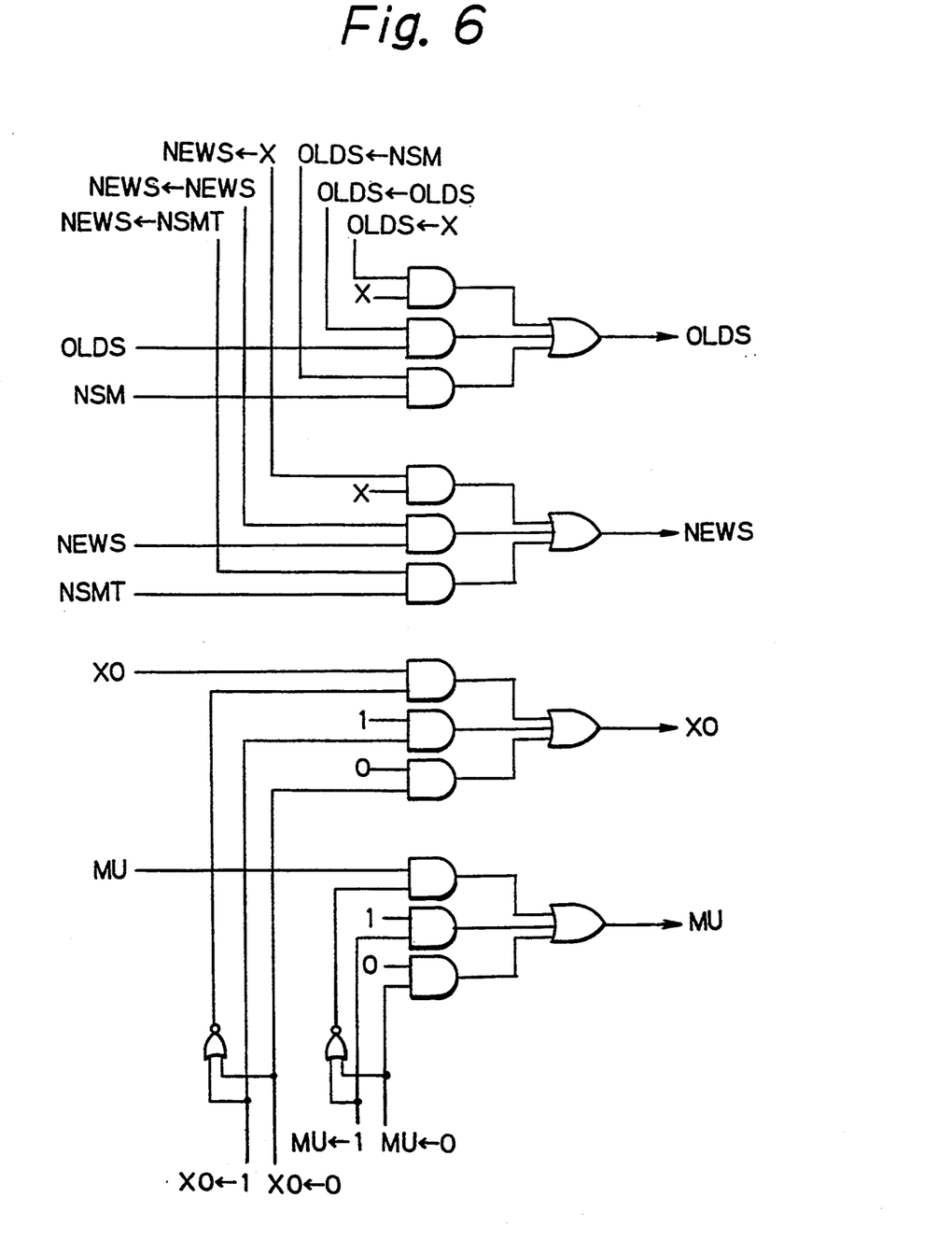
FIG. 6 is a logic circuit diagram of an example of a selector circuit in the decision logic unit 62.

FIGS. 5 and 6 show an example of the construction of the decision logic unit 62 of FIG. 3. In a logic circuit of FIG. 5, various signals for selecting data fed to the output register 72 and the EDM 64 are generated based on the contents of EDM 64, NSM 14, NSMT 16 and the input register 70. In selector circuits of FIG. 6, data are selected according to selection signals.

Figure 7A:
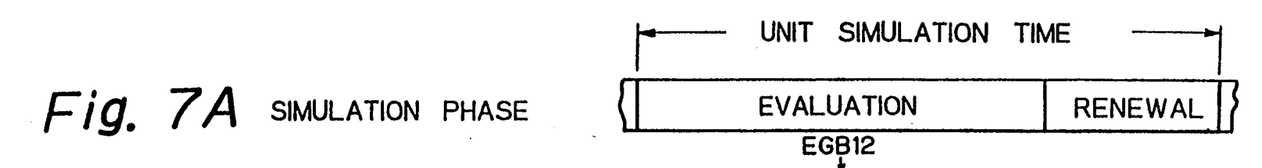
FIGS. 7A to 7H are timing charts showing operations of components of the evaluation processor of FIG. 7.
Figures 7B, 7C:
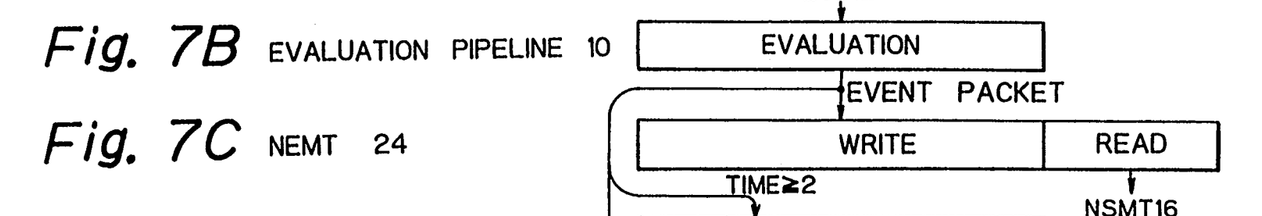
Figure 7D:
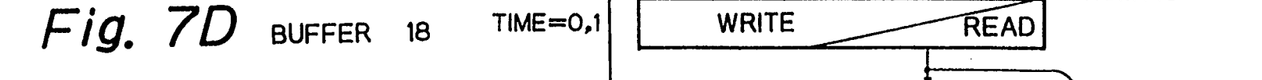
Figure 7E:
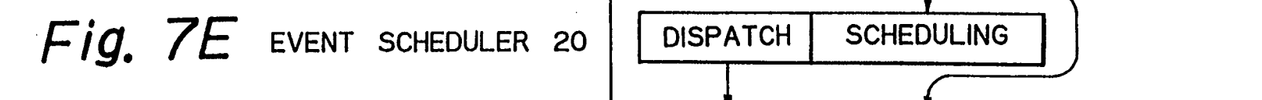
Figures 7F, 7G:
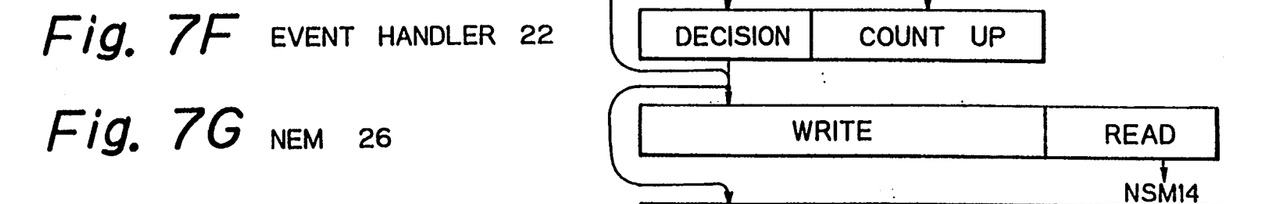

FIGS. 7A to 7H are timing charts showing operations of components of the evaluation processor shown in FIG. 1. As shown in FIG. 7A, a single simulation time unit includes an evaluation phase and a renewal phase. In the evaluation phase, the evaluation pipeline 10 operates as shown in FIG. 7B, and event packets released from the evaluation pipeline 10 are stored in the NEMT 24 as shown in FIG. 7C. In addition, event packets having 2 or more delay time units are stored in the buffer 18 as shown in FIG. 7D and the other events are stored in the NEM 26 as shown in FIG. 7G. In the event scheduler 20, the evaluation phase is divided into a dispatching phase and a scheduling phase, as shown in FIG. 7E. In the scheduling phase of the event scheduler 20, the event handler 22 counts the EVCNT, with regard to each of the devices, up by 1 when an event is scheduled in the event scheduler 20, as shown in FIG. 7F. In the dispatching phase of the event scheduler 20, the event handler 22 handles events dispatched from the scheduler 20, and counts the EVCNT down. In the dispatching phase, events released from the evaluation pipeline 10 are stored in the buffer 18, and in the scheduling phase, write and read operations to and from the buffer 18 are carried out as shown in FIG. 7D.

Figure 7H:
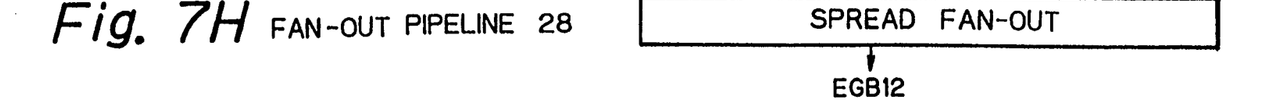

In the renewal phase, the contents of NSM 14 and NSMT 16 are renewed using the contents of NEM 26 and NEMT 24, respectively, as shown in FIGS. 7C and 7G. As shown in FIG. 7H, the fan-out pipeline 28 operates through the evaluation phase and the renewal phase.

Figure 8:
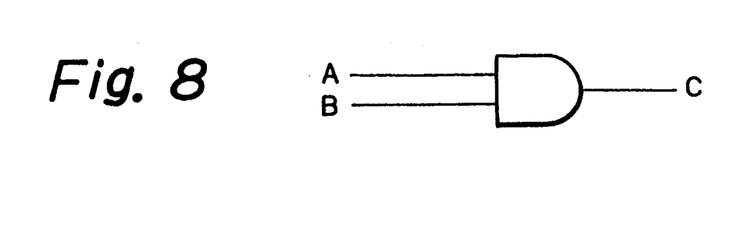
FIG. 8 a logic diagram of an AND gate used to explain an example of operation of the event handler 22.
Figure 9A:
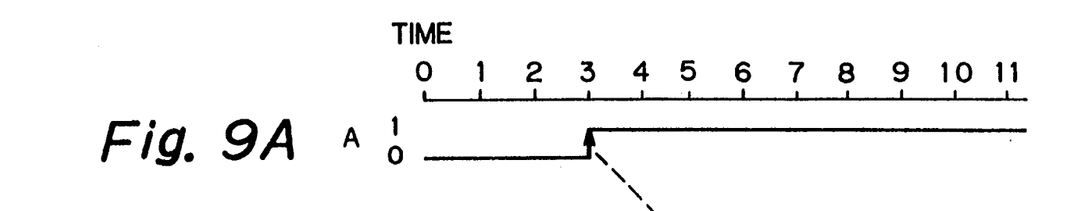
FIGS. 9A to 9C are timing charts for explaining detection of event-outstripping.
Figure 9B:
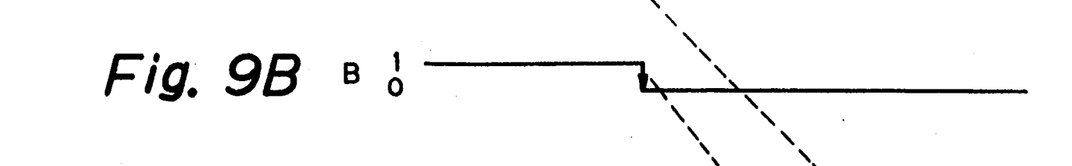
Figure 9C:
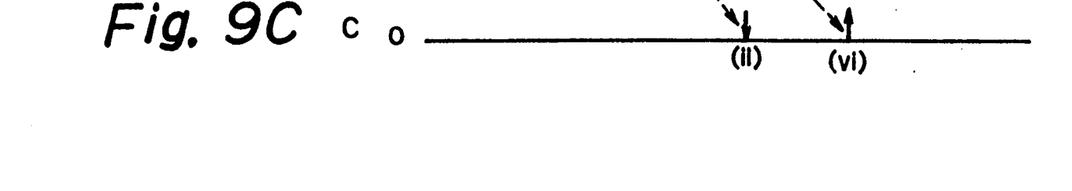

An operation of the event handler 22 is explained next regarding a case where an operation of an AND gate shown in FIG. 8 is simulated. Rising and falling propagation delay times of the AND gate are assumed to be 5 and 2 units, respectively. As shown in FIGS. 9A to 9C, suppose that an input A is changed from 0 to 1 at simulation time 3 and an input B is changed from 1 to 0 at simulation time 4. In the scheduling phase of the time 3, a first event raising the output C is scheduled, and EVCNT is increased to 1. In the renewal phase of the time 3, NSMT of the device is changed from 0 to 1. In the scheduling phase of time 4, a second event lowering the output C, i.e., OLDS=1, NEWS=0 is scheduled because NSMT=1, and EVCNT is increased to 2. In the renewal phase of the time 4, NSMT is set to zero. In the dispatching phase of time 6, the second event is dispatched and the case (ii) occurs because MU=0, EVCNT=2, NSM=0 and OLDS=1. Therefore the second event is cancelled, MU is set to 1, and EVCNT is decreased to 1. In the dispatching phase of time, the first event is dispatched and the case (vi) occurs because MU=1, EVCNT=1, NSM=0, and NSMT=0. As a result, as far as the AND gate of FIG. 8 is concerned, no event is released from the event handler 22.

Figure 10A:
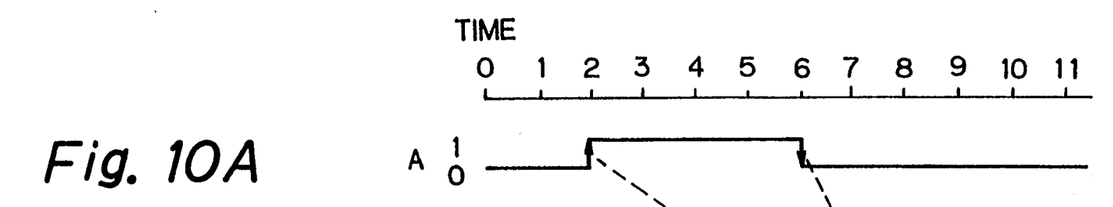
FIGS. 10A to 10F are timing charts for explaining detection of a glitch.
Figure 10B:
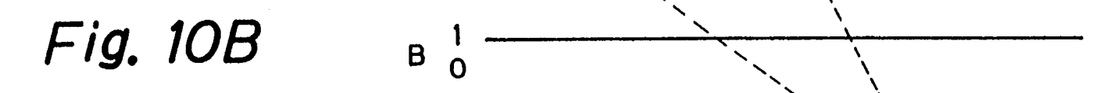
Figure 10C:
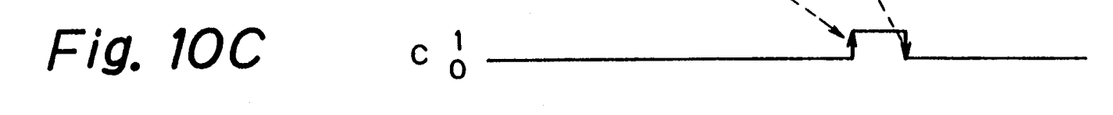
Figure 10D:
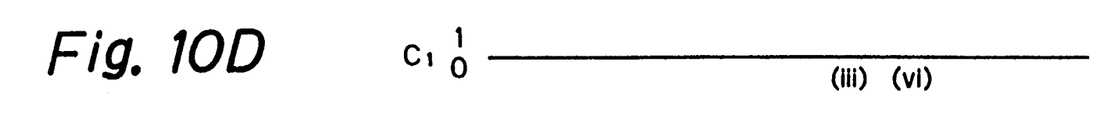
Figure 10E:
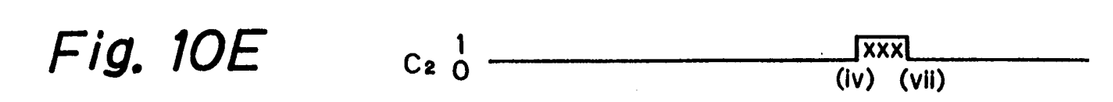
Figure 10F:
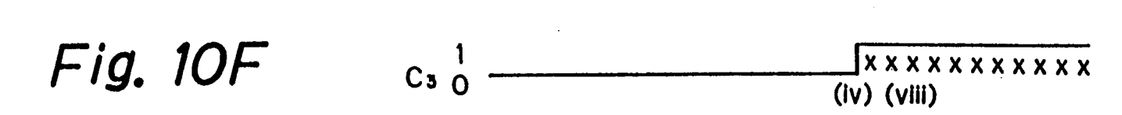

As shown in FIGS. 10A and 10B, the input A is changed from 0 to 1 at time 2 and is changed from 1 to 0 at time 6, and the input B is kept at a level "1". Then, a first event raising the output C is scheduled at time 2 and a second event lowering the output C is scheduled at time 6. The first event is dispatched from the event scheduler at time 7 and the second event is dispatched at time 8, as shown in FIG. 10C. If MODE of the AND gate is set to zero, case (iii) and case (vi) occur at time 7 and time 8, respectively, as shown in FIG. 10D, and no event is released from the event handler 22. If MODE is set to 1, case (iv) and case (vii) occur at time 7 and 8, respectively, as shown in FIG. 10E, and an undefined value is output from the output C between the time 7 and 8. If MODE is set to 2, case (iv) and case (viii) occur at time 7 and 8, respectively, and the undefined value is held after the time 8.

Figure 11A:
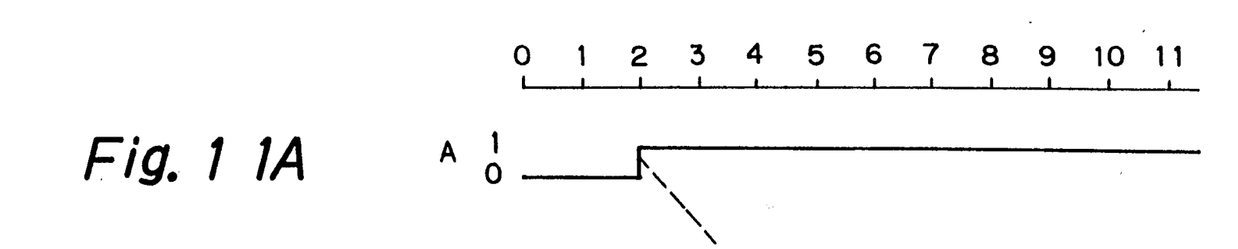
FIGS. 11A to 11C are timing charts for explaining handling of multiple events consisting of three events.
Figure 11B:
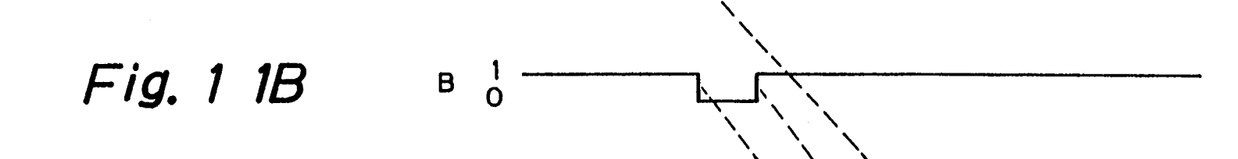
Figure 11C:
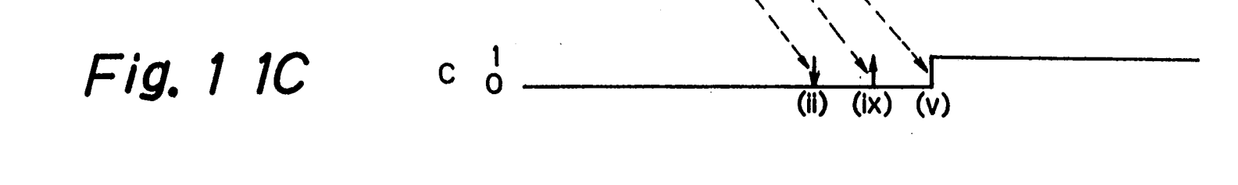

Supposing that the input A is changed from 0 to 1 at time 2, the input B is changed from 1 to 0 at time 3 and is recovered at time 4 as shown in FIGS. 11A and 11B, three events are scheduled in time 2, 3 and 4. In the dispatching phase, case (ii), case (ix) and case (v) occur at time 5, 6 and 7, respectively. The first and second events are cancelled, and the output C is changed from 0 to 1 at time 7 by the third event.

I claim:

1. A circuit for handling events occurring in event driven simulation of a logic circuit consisting of a plurality of simulated devices, comprising:
   scheduling means for scheduling the events according to respective delay times of the events and for dispatching the events as mature events after the delay times elapse;
   counting means for counting events scheduled by said scheduling means and not yet dispatched, with respect to each of the simulated devices, to product count values, each count value corresponding to one of the simulated devices;
   storing means for storing the count values generated by said counting means;
   decision means for deciding disposition of each mature event to be dispatched by said scheduling means based on the count value for a corresponding simulated device and contents of the mature event; and
   handling means for handling the mature event according to the disposition decided by said decision means.

2. A circuit as claimed in claim 1,
   wherein said decision means includes detection means for detecting occurrence of event-outstripping and glitches based on the count value and a current status of the corresponding simulated device when the disposition is decided, and
   wherein said handling means includes cancellation means for cancelling the mature event when the event-outstripping is detected by said detections means; and modifying means for modifying the mature event when one of the glitches is detected by said detection means.

3. A circuit as claimed in claim 2, wherein said decision means and said handling means consist of a combination logic unit operatively connected to said storing means and said scheduling means.

4. A circuit as claimed in claim 3, wherein said counting means counts up by 1 when an event is scheduled by said scheduling means and counts down when the disposition of the mature event is decided by said decision means.

5. A circuit as claimed in claim 3, wherein said storing means further stores mode data specifying an output mode when one of the glitches is detected by said detection means in address corresponding to one of the count values.

6. A circuit as claimed in claim 5, wherein said modifying means modifies the mature event according to the mode data of the corresponding simulated device.

7. A circuit as claimed in claim 3,
wherein said decision means includes means for identifying a first-maturing event of multiple events, said detection means detecting the event-outstripping when an old status of the first-maturing event is not equal to a current status, and
wherein the detection means detects one of the glitches when the old status of the first-maturing event is equal to the current status.

8. A logic simulator for performing event driven simulation of a logic circuit consisting of a plurality of simulated devices, comprising:
evaluation means for evaluating a future status of a corresponding simulated device to release an event when the future status is not equal to a current status of the corresponding simulated device;
scheduling means for scheduling the event released from said evaluation means to dispatch a mature event;
counting means for counting events scheduled by said scheduling means and not yet dispatched for each of the simulated devices to produce count values, each count value corresponding to one of the simulated devices;
storing means for storing the count values generated by said counting means;
decision means for deciding disposition of the mature event based on the count value of the corresponding simulated device and contents of the mature event;
handling means for handling the mature event according to the disposition decided by said decision means;
means for determining fan-out devices of the corresponding simulated device for the mature event;
means for storing identifiers of the fan-out devices to prepare for a next evaluation time by said evaluation means; and
means for renewing the current status of the corresponding simulated device according to the mature event handled by said handling means.

9. A logic simulator as claimed in claim 8,
wherein said decision means includes detection means for detecting occurrence of event-outstripping and glitches based on the count value and the current status of the corresponding simulated device when the disposition is decided, and
wherein said handling means includes
cancellation means for cancelling the mature event when the event-outstripping is detected by said detections means; and
modifying means for modifying the mature event when one of the glitches is detected by said detection means.

10. A logic simulator as claimed in claim 9, wherein said decision means and said handling means consist of a combination logic unit, operatively connected to said storing means and said scheduling means.

11. A logic simulator as claimed in claim 10, wherein said counting means counts up by 1 when an event is scheduled by said scheduling means and counts down when the disposition of the mature event is decided by said decision means.

12. A logic simulator as claimed in claim 10, wherein said storing means further stores mode data specifying an output mode when one of the glitches is detected by said detection means in an address corresponding to one of the count values.

13. A logic simulator as claimed in claim 12, wherein said modifying means modifies the mature event according to the mode data of the corresponding simulated device.

14. A logic simulator as claimed in claim 10,
wherein said decision means includes means for identifying a first-maturing event of multiple events, said detection means detecting the event-outstripping when an old status of the first-maturing event is not equal to the current status, and
wherein said detection means detects one of the glitches when the old status of the first-maturing event is equal to the current status.

15. A logic simulator for performing event driven simulation of a logic circuit consisting of a plurality of simulated devices, comprising:
evaluation means for evaluating a future status of a corresponding simulated device from a current input thereof to release an event having a delay time when the future status is not equal to a current status of the corresponding simulated device;
scheduling means for scheduling the event released from said evaluation means according to the delay time thereof, and for dispatching the event after the delay time elapses;
counting means for counting events scheduled but not dispatched by said scheduling means for each of the simulated devices to produce count values;
storing means for storing the count values generated by said counting means;
decision means for deciding disposition of a mature event to be dispatched by said scheduling means, based on the count value of the corresponding simulated device, a status of the corresponding simulator device, and contents of the mature event;
handling means for handling the mature event according to the disposition decided by said decision means;
means for determining fan-out devices of the corresponding simulated device for the mature event;
means for storing identifiers of the fan-out devices to prepare for a next evaluation time by said evaluation means; and
means for renewing the current status of the corresponding simulated device according to the mature event handled by said handling means.

* * * * *

UNITED STATES PATENT AND TRADEMARK OFFICE
CERTIFICATE OF CORRECTION

PATENT NO. : 5,418,735

DATED : May 23, 1995

INVENTOR(S) : Saitoh

It is certified that error appears in the above-indentified patent and that said Letters Patent is hereby corrected as shown below:

Col. 8, line 7, "time," should be --time 8,--.

Col. 9, line 19 (claim 5, line 4), after "in" insert --an--.

Signed and Sealed this

Twenty-fifth Day of February, 1997

Attest:

BRUCE LEHMAN

*Attesting Officer*   *Commissioner of Patents and Trademarks*